United States Patent [19]

Farrell et al.

[11] 4,199,380

[45] Apr. 22, 1980

[54] INTEGRATED CIRCUIT METHOD

[75] Inventors: Michael G. Farrell, Phoenix; Sal T. Mastroianni, Mesa, both of Ariz.

[73] Assignee: Motorola, Inc., Schaumburg, Ill.

[21] Appl. No.: 960,143

[22] Filed: Nov. 13, 1978

[51] Int. Cl.² .............................................. H01L 21/26
[52] U.S. Cl. ................................... 148/1.5; 148/187; 148/175; 357/34
[58] Field of Search .................. 148/1.5, 187, 175; 357/34

[56] References Cited

U.S. PATENT DOCUMENTS

| | | | |
|---|---|---|---|
| 4,060,427 | 11/1977 | Barile et al. | 148/1.5 |
| 4,066,473 | 1/1978 | O'Brien | 148/1.5 |
| 4,110,125 | 8/1978 | Beyer | 148/187 X |
| 4,111,726 | 9/1978 | Chen | 148/175 |
| 4,118,250 | 10/1978 | Horng et al. | 148/187 X |
| 4,131,497 | 12/1978 | Feng et al. | 148/187 |
| 4,135,954 | 1/1979 | Chang et al. | 148/187 |
| 4,155,777 | 5/1979 | Dunkley et al. | 148/1.5 |
| 4,155,778 | 5/1979 | Antipav | 148/1.5 |

Primary Examiner—G. Ozaki
Attorney, Agent, or Firm—John A. Fisher

[57] ABSTRACT

A method for fabricating self-aligned, walled emitter, oxide isolated integrated circuits. A layer of oxidation resistant material is formed on an oxide isolated epitaxial layer on a silicon substrate. A pattern of apertures is opened in the oxidation resistant layer to expose portions of the epitaxial layer. The apertures extend across the oxide isolated silicon material and define the spaces between the contacts of the active devices of the circuit. Dopant impurities are applied through these apertures to form an inactive base region. The substrate is heated in an oxidizing ambient to form a relatively thick oxide on a portion of the epitaxial layer exposed through the apertures. The oxidation resistant layer is again selectively etched to expose those portions of the epitaxial layer where the active device regions are to be formed. In this step a single mask is used to open a plurality of device regions. The mask is used in conjunction with the oxide isolation and the relatively thick oxide to precisely define the spacing between these regions. Dopant impurities are applied through selected openings to form the active base region. Opposite type dopant impurities are applied through the same openings to form the emitter regions. Dopant impurities are also applied through further selected openings to form base contact areas and collector contact areas. The integrated circuit device thus formed has a base and emitter structure which is bounded on its edges by the isolation oxide or by the relatively thick oxide.

11 Claims, 12 Drawing Figures

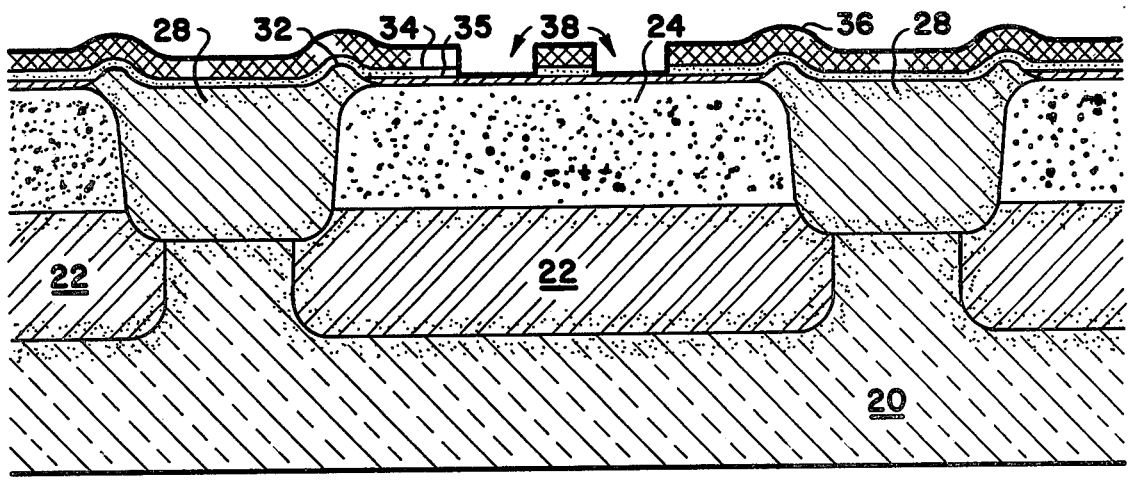
Fig 5
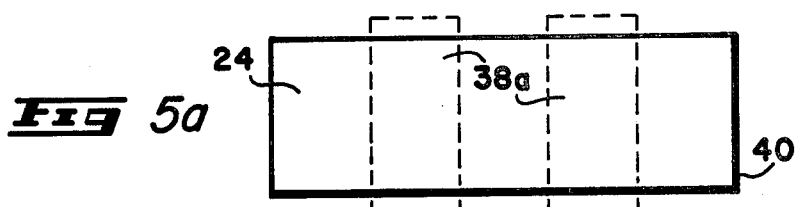
Fig 5a
Fig 6
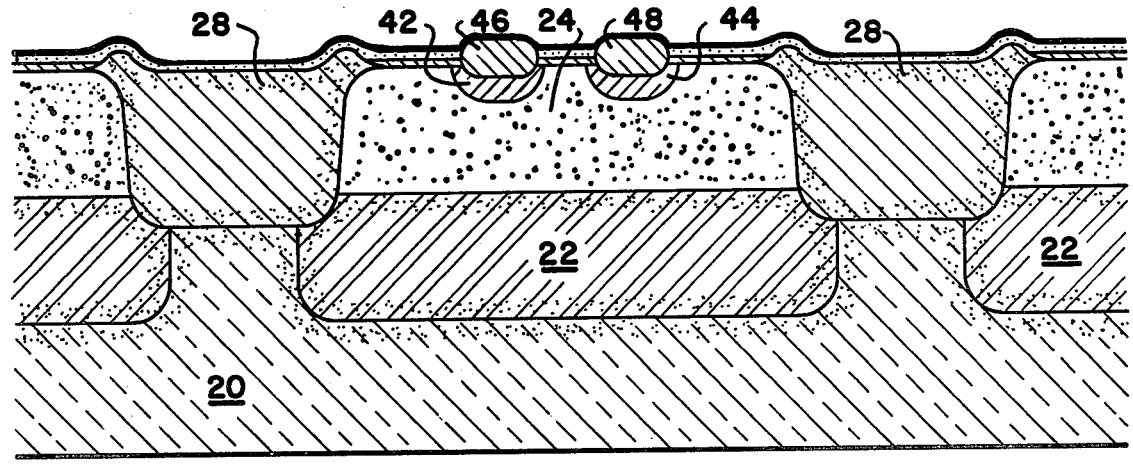
Fig 7
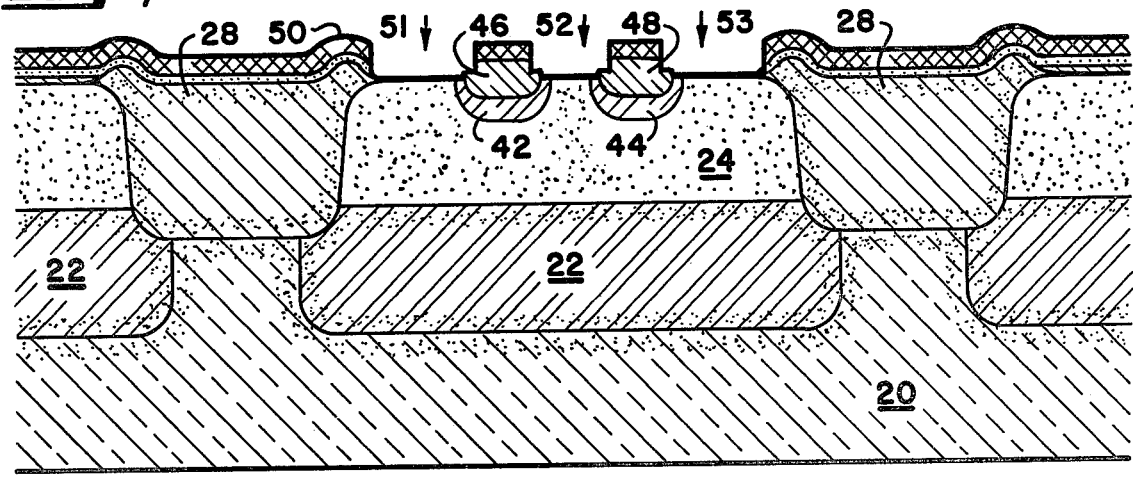

INTEGRATED CIRCUIT METHOD

BACKGROUND OF THE INVENTION

This invention relates to a process for forming an integrated circuit structure, and more particularly, to a process for forming a self-aligned, oxide isolated, walled emitter integrated circuit structure.

The advantages of an oxide isolated bipolar integrated circuit structure are well recognized, and include, in particular, increased circuit operating speed and increased packing density. In this structure iolation between adjacent devices is provided by an isolation oxide which extends through the epitaxial layer to the underlying substrate. Devices are thus isolated on the edge by the oxide and on the bottom by the PN junction between the epitaxial layer and the substrate. Still further increases in speed and density can be achieved with a walled emitter structure, that is, a structure in which the emitter region terminates at the oxide isolation. To fully realize the optimum in packing density, device contact areas must be self-aligned since otherwise valuable space must be expended to provide for possible misalignment tolerances.

While the advantages of oxide isolated, walled emitter structures have been recognized, available processes have heretofore been inadequate for reliably producing such structures. Some prior art process have led to low yields primarily due to emitter-to-collector leakage and/or shorting. This results from the particular diffusion profile adjacent the oxide isolation, and specifically results from the well known "breaking" which occurs in processes which employ localized oxidation. To overcome such yield limitations, other prior art structures have resorted to epitaxial bases or the like which sacrifice a major portion of the performance and density benefit sought.

Accordingly, it is an object of this invention to provide a process for fabricating high yielding, oxide isolated, walled emitter device structures.

It is a further object of this invention to provide a process for fabricating high density, potentially high speed, self-aligned integrated circuit structures.

It is a still further object of this invention to provide a process for fabricating high speed integrated circuit structures wherein device current gain and base series resistance can be independently controlled.

BRIEF SUMMARY OF THE INVENTION

In one embodiment of the invention a silicon wafer in which oxide isolated islands have been formed is coated with an oxidation resistant layer. Apertures are etched in the oxidation resistant layer to form openings extending across the islands and exposing the underlying silicon. Impurities are applied through these openings to dope an inactive base region. The substrate is then heated in an oxidizing ambient to form relatively thick oxide regions in the exposed silicon. A second set of apertures are opened in the oxidation resistant layer using, in combination, a photoresist layer, the oxide isolation, and the relatively thick oxide regions to define the apertures. These apertures, opened in one composite masking operation, define and provide self-alignment between the active base and emitter, base contact region, and collector contact region. Dopant impurities are applied through selected apertures to dope the active base region. Further impurities are applied through the same selected apertures to form emitter regions. Still further dopants are applied, independently, to form base contact regions and collector contact regions. The structure so formed has base and emitter regions which terminate at the oxide isolation. The active base, inactive base, and base contact regions can be doped independently, and thus can be designed for optimum device performance.

BRIEF DESCRIPTION OF THE DRAWINGS

Other objects and advantages of the invention will become apparent upon reading the following detailed description and upon reference to the drawings, in which:

FIGS. 5-10 are cross sections of device structures at various stages of the process in accordance with one embodiment of the invention.

FIG. 5a is a top view showing the relationship between mask and isolation structure.

DETAILED DESCRIPTION OF THE INVENTION

Figure 1:
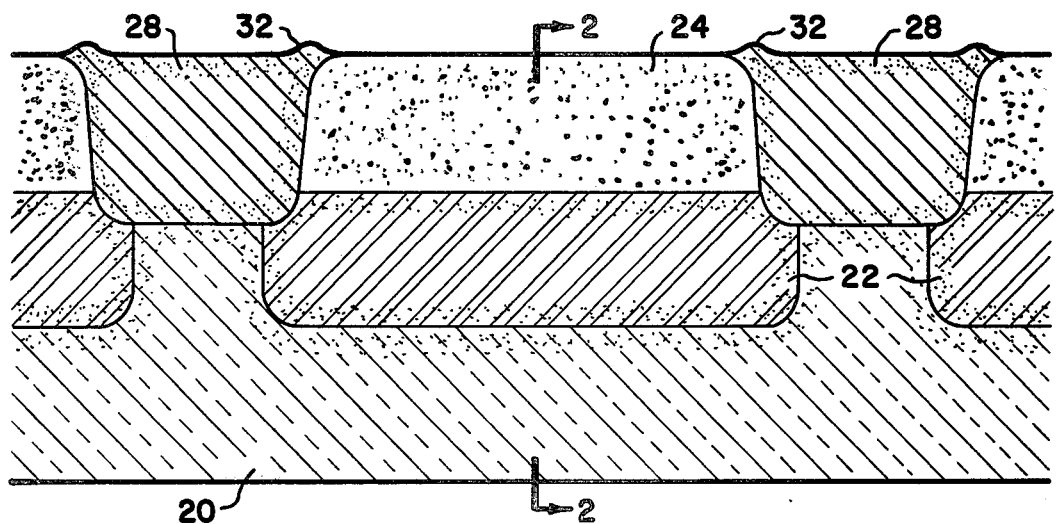
FIGS. 1-4 are cross sections of prior art structures.

FIG. 1 shows, in cross-section, a portion of a partially fabricated integrated circuit structure. In this embodiment a semiconductor wafer 20 has been provided with a buried layer region 22. Overlying the substrate 20 and buried layer 22 is an epitaxial layer. The epitaxial layer is shown divided into separate, isolated islands such as island 24 by oxide isolation regions 28. While an integrated circuit wafer would contain a large plurality of such isolated epitaxial regions, only one such region is shown in the Figure as one is sufficient to demonstrate the practice of the invention. The region 24 will be used for the fabrication of a bipolar transistor which will likely be one of many in an integrated circuit structure. The circuit, of course, might additionally contain other circuit elements such as resistors, diodes, and the like. In most applications the substrate wafer 20 is P type, and the buried layer regions 22 are doped heavily N type. The epitaxial region 24 could be, for example, about 1.5 micrometers in thickness and doped to about 1 ohm centimeter N type. The structure as shown in FIG. 1 is a conventional structure in the formation of oxide isolated circuits. The well known "beaks" of oxide indicated by the number 32 are the natural result of the process used for forming the oxide isolation regions 28. The processes used to achieve the structure as shown in FIG. 1 are well known in the semiconductor art, and hence will not be further described.

Figure 2:
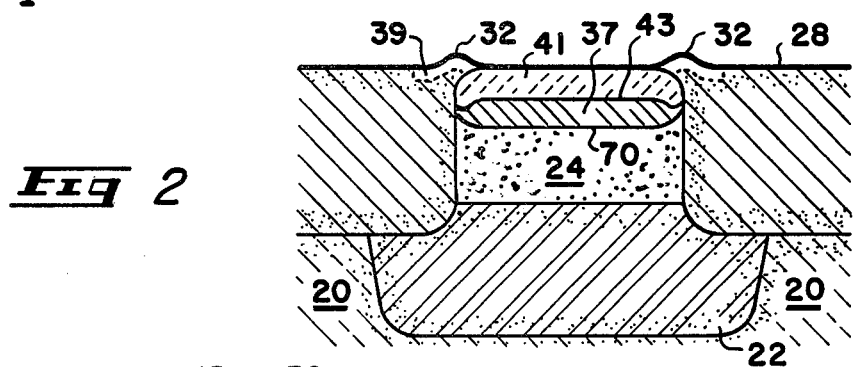

FIG. 2 shows a cross section perpendicular to the sectional view of FIG. 1 after further processing. This view through the epitaxial island 24 shows the oxide beaks in relationship to the silicon island. In prior art processes a masking layer of silicon dioxide or other material would be grown or deposited on the silicon surface. This masking layer would then be selectively patterned to expose portions of the silicon surface. Dopant impurities would be diffused or ion implanted into the epitaxial layer through apertures in the masking layer to form a base region 37. The profile of the base-epitaxial region junction 70 is determined by the shape of the silicon surface and by the presence and shape of the oxide beaks 32 and would be shaped as shown in FIG. 2. This results in the junction being shallower at the edge of the epitaxial island where the silicon abuts the isolation oxide 28. Following the base diffusion, a further masking layer could be grown or deposited on the silicon surface and selectively patterned to define an emitter area. The mask for the emitter area patterning must overlap onto the isolation oxide 28 to ensure that, even with some misalignment, the emitter area abuts the isolation oxide. Overlapping the emitter area mask onto the oxide 28 necessarily results in some etching of the oxide as shown by the dotted line 39. More significantly, this results in an etching of the beak area 32. When an emitter 41 is now diffused into the base 37 the profile of the base emitter junction, because of this etching of the beak area, will be as shown by the line 43. Adjacent the oxide 28 the base width is significantly narrower than the interior portion of the base. This base width narrowing at the oxide boundary can cause collector emitter leakage, low collector emitter breakdown, or collector emitter shorts in very severe cases.

Figure 3:
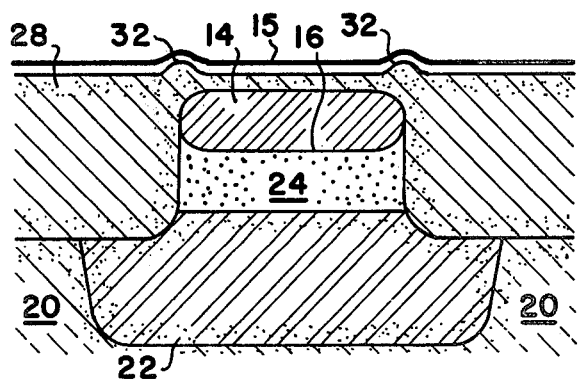
Figure 4:
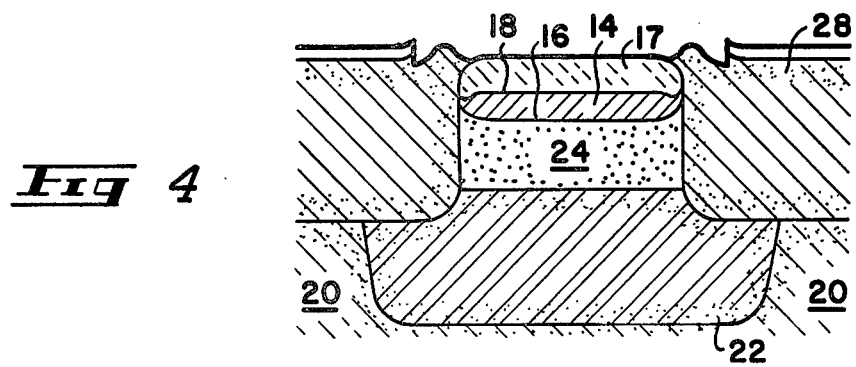

An alternate prior art process results in an even less desirable situation as shown in FIG. 3 which is a cross sectional view similar to the section of FIG. 2. In this embodiment, the base 14 is ion implanted through a masking layer 15 which is grown or deposited on the surface of the epitaxial region 24. The layer 15 could be, for example, a silicon nitride layer also used to achieve the localized oxide isolation 28 or it could be a freshly deposited layer. The base can be implanted through this layer in selective locations by using a patterned photoresist layer as a mask. The base-epitaxial layer junction profile 16 again results from the shape of the oxide beak 32 and the contour of the surface of the epitaxial layer 24. The layer 15 is then patterned for the selective diffusion of an emitter 17 as shown in FIG. 4 into the base 14. Allowance for misalignment of the emitter mask will again cause an etching and a change in the shape of the beak 32. Upon subsequent diffusion of the emitter 17, the emitter-base junction profile 18 will be as shown and will again result in excessive emitter-collector leakage or an emitter-collector short.

In the practice of the present invention, the process is continued from FIG. 1 by forming an oxidation resistant film 34 overlying the wafer surface as shown in FIG. 5. The film 34 is preferably formed of silicon nitride, but could also be formed of other oxidation resistant materials such as aluminum oxide or the like. The film 34, if of silicon nitride, can be formed by conventional techniques such as chemical vapor deposition from a mixture of silane and ammonia. The film preferably has a thickness in the range of 500 to 2000 Angstroms and, if desired for processing convenience, can be separated from the silicon surface by a thin layer 35 of silicon dioxide.

A layer of photoresist 36 is applied over the oxidation resistant layer 34, and is patterned using conventional photolithographic techniques. The patterned photoresist layer is then used as an etch mask to open apertures in the oxidation resistant layer. These apertures define the inactive base region and provide the basis for the self-aligned device structure. The use of this one reverse master mask provides the critical alignment required between active device areas in an indirect manner by defining the inactive device areas. FIG. 5a shows the relationship between the mask used to pattern the apertures 38 and the oxide isolation 28. The edge of the isolation region is shown by the line denoted by the number 40. The mask openings 38a which result in the apertures 38 in the oxidation resistant layer extend across the epitaxial region 24 and overlap onto the oxide isolation 28. Overlapping in this manner eliminates any restrictive alignment tolerances. An appreciable amount of misalignment is permitted as long as the openings 38a extend completely across the region 24. The patterned photoresist layer 36 is used as an etch mask for the oxidation resistant layer 34 and also as an ion implantation mask. It is not necessary, in this etch step, to remove the oxide layer 35. Whether the oxide layer is removed or not, reference will be made to the "exposed" portion of the epitaxial layer. By that is meant the portion of the epitaxial layer which is no longer covered by an oxidation resistant layer and which is, therefore, exposed to subsequent oxidations. Boron ions are implanted through the apertures 38 to form a P doped inactive base region. The combination of the photoresist layer 36 and the oxidation resistant layer 34 provide a barrier to the implanted ions and prevent the penetration of the ions into portions of the device where they are not desired. As an alternate to this process step, the layers 34, 35 could be patterned using the photoresist layer 36 as a mask. After removing the photoresist, the inactive base could be implanted using an ion implant of sufficiently low energy to be masked, in the desired pattern, by the remainder of the layers 34, 35 and by the isolation oxide 28.

The photoresist layer 36 is removed and the silicon wafer is heated in an oxidizing ambient. This heating step redistributes the implanted boron ions to form P doped inactive base regions 42 and 44 as shown in FIG. 6. The high temperature oxidizing ambient also oxidizes localized regions of the silicon surface that are exposed through the oxidation resistant layer 34. The relatively thick oxide regions 46, 48 can be a few thousand Angstroms in thickness and are partially recessed into the silicon surface by the nature of the localized oxidation process.

In FIG. 7 a photoresist layer 50 has been applied to the surface of the wafer and patterned using an oversized master mask. The oversized master mask simultaneously provides apertures for the collector contact 51, for the active base and emitter 52, and for the base contact 53. The apertures are etched in the dielectric layer 34 (and 35, if desired) using the photoresist layer 50 in combination with the relatively thick oxide 46, 48 and the isolation oxide 28. Since the apertures for the transistor are defined by the already formed oxide, the openings in the photoresist layer 50 can be oversized; no tight alignment tolerances are required. By opening all of the apertures at the same time, using a single master mask, the apertures are self aligned to one another. No subsequent critical alignments are required to define the space between apertures.

Figure 8:
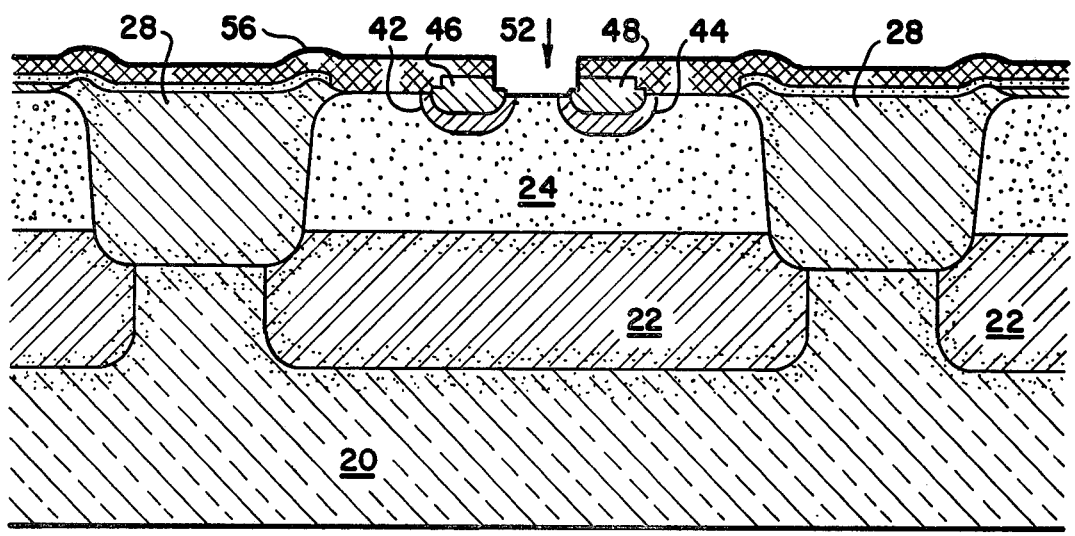

Once the plurality of openings have been formed in the oxidation resistant layer, the photoresist layer 50 can be removed. This photoresist layer is replaced in subsequent steps by further photoresist layers which are selectively patterned to allow dopant impurities to be applied to selected exposed portions of the wafer. FIG. 8 shows, for example, a photoresist layer 56 which has been patterned to reopen the previously opened aperture 52. The photographic mask used to pattern the layer 56 can again be an oversized mask having noncritical alignment tolerances. The patterned photoresist layer 56 is used as an ion implantation mask, and dopant impurities such as boron are applied through the aperture 52 to form the active base region. The masking photoresist layer 56 is then removed. In like manner, but not shown in the Figures because of the similarity to FIG. 8, another photoresist layer is applied to the surface of the wafer. This photoresist layer is selectively patterned to reopen aperture 51 and to again reopen aperture 52. Dopant impurities of the opposite doping type such as arsenic are applied through apertures 51 and 52 to dope the collector contact region and emitter region respectively. The patterned photoresist layer is again removed and another layer of photoresist is applied over the surface of the wafer. This photoresist layer is again selectively patterned, this time to reopen aperture 53. Using the photoresist layer, the isolation oxide, and the relatively thick oxide regions is an ion implantation mask, dopant ions of a first dopant type can be applied through these apertures to dope a base contact region.

A number of alternate embodiments to the basic process are possible. In one such variation, the base contact 53 can be formed by implanting boron ion through the dielectric layers 34, 35 prior to using the reverse master mask as shown in FIG. 5. The contacts can be selectively implanted using a patterned photoresist layer as a mask. Following the implantation step, the process continues by the application of the master mask as in FIG. 5.

Figure 9:
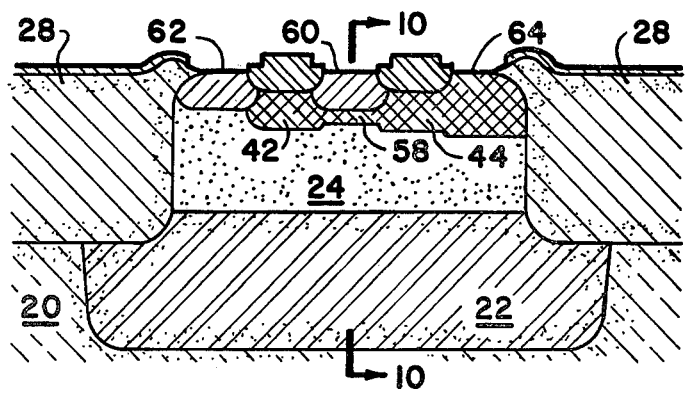

The last photoresist layer can be stripped from the surface of the wafer and the wafer heated in a non-oxidizing or only slightly oxidizing ambient to simultaneously redistribute all of the individual ion implantations. The non-oxidizing or only slightly oxidizing ambient allows subsequent contact to be made to the device regions without requiring a separate photoresist operation to provide device contact openings. Only a short buffer etch is required before applying the device metallization. By properly selecting the type of ion implanted, the energy and dose for the implant, and the temperature and length of time for the redistribution cycle, the proper depth and doping of the individual device regions can be individually tailored to provide an optimum device as shown in FIG. 9. In this Figure, 42 and 44 are the previously formed inactive base regions. The active base region 58 and the emitter region 60 are precisely self aligned since they were each implanted through the same aperture. The collector contact region is designated by the number 62 and the base contact by the number 64. As a specific but non-limiting example, the emitter region 60 can be implanted with arsenic at an energy of 35 Kev to a dose of $5 \times 10^{15}$ cm$^{-2}$. The base 58 can be boron implanted at an energy of about 95 Kev and at a dose of $8 \times 10^{12}$ cm$^{-2}$. Because of the difference in the diffusivity of boron and arsenic, redistributing both dopants for the same length of time, namely about 30 minutes at about 1000° C. results in the base diffusing further than the emitter and yields an effective base width of approximately 1000 Angstroms. The emitter is doped to a sheet resistivity of approximately 25 ohms per square and the base under the emitter is in the range of 3 to 7 thousand ohms per square at a total depth of approximately 0.5 micrometers. The inactive base 44 and the base contact 64 are doped totally independently of the active base and thus can be doped to optimize base performance. The inactive base can be approximately 0.7 micrometers in depth at 100 ohms per square. Such heavy doping of the inactive base is desirable to lower the base series resistance, and can be tolerated in this device structure because the emitter is accurately self-aligned with the active base. The emitter is aligned within the active base and thus, because of the process employed, there is no way that it can overlap the heavily doped inactive base. In prior art processes, if any misalignment occurred between the emitter and the inactive base, such misalignment and subsequent overlapping of the emitter and the heavily doped inactive base would result in an unacceptably low emitter-base breakdown voltage and an unacceptably high emitter-base reverse leakage current. With the process of this invention, however, the self-alignment between emitter and base allows the desirable heavy doping of the inactive base without occasioning the deleterious effects of low breakdown voltage. Further, the base contact region 64 can be very heavily doped to further reduce base series resistance and to insure the satisfactory ohmic contact to the base region. Such independent control of the active base, inactive base, and base contact permit the design of transistors with a low net doping in the active base region to enhance transistor gain and high doping in other base regions to allow a low base series resistance which enhances device speed.

Figure 10:
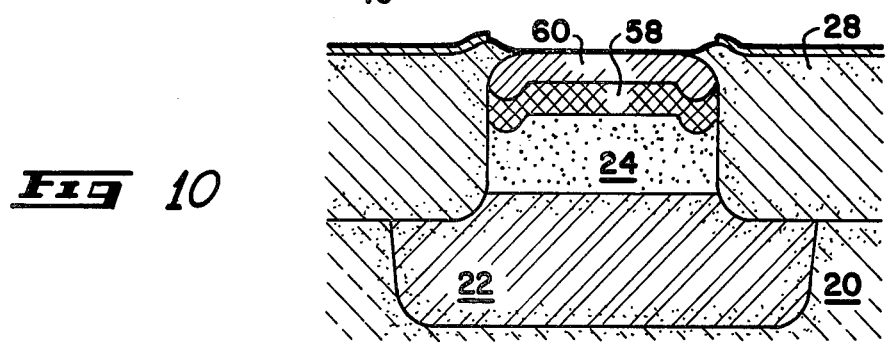

FIG. 10 shows a cross sectional view through the active base and emitter of the device of FIG. 9. The profile of the active base-epitaxial region junction is similar to that which results from the prior art process and as shown in FIG. 2. The edge of the emitter 60, however, is exactly parallel to the edge of the base 58. Thus, although the emitter penetration varies, the base penetration varies in like manner so that the effective base width, that is, the width of the base under the emitter, remains constant across the device. Even in the region adjacent the oxide isolation, the base width is constant and no undesirable collector-emitter characteristics result. The uniform base width is the result of applying the base and emitter impurities through exactly the same aperture. The isolation oxide was not etched or otherwise altered between the base and emitter implantations. The desirable results of FIG. 10 should be contrasted with the possible results of the prior art processes as shown in FIGS. 2 and 4.

Figure 11:
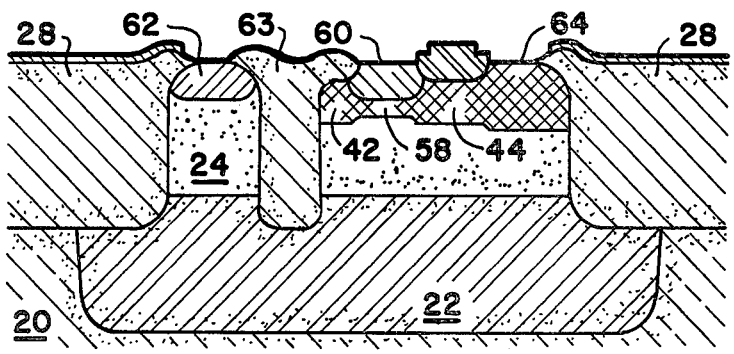
FIG. 11 is a cross section of a device structure showing a further embodiment of the invention.

A further embodiment of the invention is shown in the cross sectional view of FIG. 11. In this embodiment the collector contact 62 is separated from and isolated from the inactive base by an oxide isolation 63. Such a structure results in a higher collector-base breakdown voltage since the collector contact diffusion and the inactive base diffusion do not abut. The device shown in FIG. 11, however, requires slightly more space than the device shown in FIG. 9. The two devices, that shown in FIG. 9 and that shown in FIG. 11 can, however, be fabricated by identical processes. The isolated collector device of FIG. 11 results from a different geometrical layout of the original oxide isolation. All other processing steps are the same, and the two device embodiments can be used in the same integrated circuit layout. Where a relatively high collector-base breakdown voltage is not important, the device shown in FIG. 9 can be used to maximize device density. In those circuit portions where a high collector-base breakdown voltage is required, the device of FIG. 11 can be used.

Thus it is apparent that there has been provided, in accordance with the invention, a method for fabricating self aligned, walled emitter, oxide isolated integrated circuits that fully satisfies the objects and advantages set forth above. While the invention has been described in conjunction with specific embodiments thereof, it is evident that many alternatives and variation will be apparent to those skilled in the art in light of the foregoing description. Accordingly, it is intended that the invention embrace all such alternatives and modification as fall within the spirit and scope of the following claims.

What is claimed is:

1. A process for fabricating self-aligned, walled-emitter, oxide isolated integrated circuit devices on a silicon substrate which comprises: forming an oxidation resistant layer overlying a major surface of the silicon substrate; forming a pattern of apertures in said oxidation resistant layer; applying conductivity determining impurities of a first type through said pattern of apertures in said oxidation resistant layer to form a first region in a portion of said silicon substrate; oxidizing said silicon substrate exposed through said apertures in said oxidation resistant layer to form a localized oxide portion; forming a masking layer overlying said substrate and opening a second pattern of apertures therein, said second pattern of apertures together with said localized oxide portion defining regions on said major surface, said regions being in alignment with said first region; selectively applying conductivity determining impurities of said first type through a first group of said regions to form a second region; applying conductivity determining impurities of a second type opposite said first type through said first group of said regions to form a third region; and selectively applying conductivity determining impurities of said first type through a second group of said regions to form a fourth region.

2. The process of claim 1 wherein said first region forms an inactive base region, said second region forms an active base region, and said fourth region forms a base contact region and wherein said regions are electrically interconnected.

3. The process of claim 1 wherein said step of applying conductivity determining impurities of a second type also forms a collector contact region.

4. The process of claim 1 wherein said steps of applying impurities comprises ion implantation.

5. The process of claim 1 wherein said impurities applied through openings in said first and second groups of regions are redistributed in a non-oxidizing ambient.

6. The process of claim 1 wherein said conductivity determining impurity of one of said types is boron and said conductivity determining impurity of another of said types is arsenic.

7. The process of claim 1 wherein said second pattern of apertures further comprise contact openings to an emitter region, said fourth region, and to a collector contact region.

8. A method of making a bipolar integrated circuit device, comprising the steps of: forming oxide isolation regions surrounding a surface portion of a silicon substrate; forming an oxidation resistant layer overlying said surface portion and said oxide isolation regions; selectively applying impurities of said first type into said surface portion through said oxidation resistant layer; selectively etching said oxidation resistant layer to form first openings therein which cross said surface portion and terminate on said oxide isolation regions; applying impurities of a first type through said openings; heating said substrate in an oxidizing ambient to locally oxidize said surface portion exposed through said openings; selectively etching said oxidation resistant layer to form additional openings therein, said additional openings being adjacent to and in alignment with said oxidized surface portions; applying impurities of said first type through selected ones of said additional openings; applying impurities of a second type through selected ones of said additional openings; and heating said substrate to redistribute said impurities of said first and said second type.

9. A process for fabricating an isolated collector device, comprising the steps of: providing a semiconductor wafer having an epitaxial layer thereon, said epitaxial layer being divided into regions by oxide isolations which extend through said epitaxial layer to said semiconductor wafer, a first of said regions electrically connected to a second of said regions by a buried layer formed in said semiconductor wafer and positioned to extend under said oxide isolation; forming an oxidation resistant layer on said epitaxial layer; selectively patterning said oxidation resistant layer to form apertures therein over said first of said regions, said apertures extending across said region to at least abut said oxide isolation; applying dopant impurities through said apertures to form an inactive base; heating said semiconductor wafer in an oxidizing ambient to selectively form an oxide area in said wafer through said apertures in said oxidation resistant layer; patterning said oxidation resistant layer to form additional apertures bounded by said oxide isolation and by said oxide area, and a further aperture over said second of said regions, said further aperture bounded by said oxide isolation; selectively applying dopant impurities through said additional apertures to form an active base contacting said inactive base and an emitter within said active base; selectively applying dopant impurities through said further aperture to form a collector contact; and heating said wafer to redistribute said dopant impurities.

10. The process of claim 9 further comprising selectively applying dopant impurities through said additional apertures to form a base contact area abutting said inactive base.

11. The process of claim 9 further comprising the step of ion implanting dopant impurities through said oxidation resistant layer into selected portions of said epitaxial layer to form a base contact area.

* * * * *